United States Patent [19]
Lu et al.

[11] Patent Number: 5,864,459
[45] Date of Patent: Jan. 26, 1999

[54] PROCESS FOR PROVIDING A GLASS DIELECTRIC LAYER ON AN ELECTRICALLY CONDUCTIVE SUBSTRATE AND ELECTROSTATIC CHUCKS MADE BY THE PROCESS

[75] Inventors: Guo-Quan Lu; Jaecheol Bang, both of Blacksburg, Va.

[73] Assignee: Virginia Tech Intellectual Properties, Inc., Blacksburg, Va.

[21] Appl. No.: 700,605

[22] Filed: Aug. 14, 1996

[51] Int. Cl.$^6$ .................................................. H02N 13/00
[52] U.S. Cl. .......................................... 361/234; 279/128
[58] Field of Search ................................. 361/233, 234, 361/230; 501/55, 65, 66, 72; 279/128

[56] References Cited

U.S. PATENT DOCUMENTS

| | | | |
|---|---|---|---|
| 2,175,689 | 10/1939 | Gallup | 501/65 |
| 2,688,560 | 9/1954 | Armistead | 501/65 |
| 3,035,928 | 5/1962 | Searight | 501/65 |
| 3,171,750 | 3/1965 | Bennett et al. | 501/65 |
| 3,175,937 | 3/1965 | Bayer et al. | |
| 3,253,200 | 5/1966 | Klass et al. | |
| 3,379,942 | 4/1968 | Davis | |
| 3,495,964 | 2/1970 | Hares et al. | 501/65 |
| 3,784,384 | 1/1974 | Webb | 501/55 |
| 3,867,166 | 2/1975 | Sullivan | 501/55 |
| 4,221,824 | 9/1980 | Leonard et al. | |
| 4,259,118 | 3/1981 | Sack | 501/66 |
| 4,689,271 | 8/1987 | Schittenhelm et al. | |
| 4,692,836 | 9/1987 | Suzuki | |
| 4,724,510 | 2/1988 | Wicker et al. | 361/234 |
| 4,767,672 | 8/1988 | Fujinaka et al. | 501/66 |
| 4,864,461 | 9/1989 | Kasahara | |
| 5,055,964 | 10/1991 | Logan et al. | |
| 5,077,240 | 12/1991 | Hayden et al. | 501/55 |
| 5,104,834 | 4/1992 | Watanabe et al. | |
| 5,140,109 | 8/1992 | Matsumoto et al. | 501/55 |
| 5,155,652 | 10/1992 | Logan et al. | |
| 5,166,856 | 11/1992 | Liporace et al. | |
| 5,198,393 | 3/1993 | Grebe et al. | 501/65 |
| 5,207,437 | 5/1993 | Barnes et al. | |
| 5,296,294 | 3/1994 | Suzuki et al. | 501/55 |
| 5,348,916 | 9/1994 | Kushitani et al. | 501/66 |
| 5,376,213 | 12/1994 | Ueda et al. | |
| 5,384,681 | 1/1995 | Kitabayashi et al. | |
| 5,400,209 | 3/1995 | Moslehi et al. | 361/234 |
| 5,413,360 | 5/1995 | Atari et al. | |
| 5,512,521 | 4/1996 | Fu et al. | |

OTHER PUBLICATIONS

Bang et al., "Densification Kinetics of Glass Films Constrained on Rigid Substrates," *J Mater. Res.*, vol. 10, No. 5, pp. 1321–1326 (1995).

Choe et al., "Constrained–film Sintering of a Gold Circuit Paste", *J. Mater. Res.*, vol. 10, No. 4, pp. 986–994 (1995).

Watanabe et al., "Electrostatic Charge Distribution in the Dielectric Layer of Alumina Electrostatic Chuck", *J. Mater. Sci.* 29, pp. 3510–3516 (1994).

Bang et al., "Constrained–Film Sintering of a Borosilicate Glass: In Situ Measurement of Film Stresses," *J. Am. Ceram. Soc.*, 78(3), pp. 813–815 (1995).

Abstract of Japanese Patent Application No. 05–19462 (Aug. 5, 1994).

Abstract of Japanese Patent Application No. 04–344893 (Jul. 15, 1994).

Abstract of Japanese Patent Application No. 04–109715 (Nov. 16, 1993).

Abstract of Japanese Patent Application No. 04–70163 (Sep. 10, 1993).

(List continued on next page.)

*Primary Examiner*—Fritz Fleming
*Attorney, Agent, or Firm*—Oliff & Berridge, PLC

[57] ABSTRACT

Processes for providing a durable glass dielectric layer on an electrically conductive substrate are disclosed. Also disclosed are electrostatic chucks made by the process that include an electrically conductive substrate coated with a layer of glass having a composition that includes 60 wt. % to 80 wt. % $SiO_2$.

19 Claims, 1 Drawing Sheet

OTHER PUBLICATIONS

Abstract of Japanese Patent Application No. 03–190023, Feb. 12, 1993.
Abstract of Japanese Patent Application No. 03–91233 (Jan. 11, 1994).
Abstract of Japanese Patent Application No. 03–76850 (Oct. 12, 1992).
Abstract of Japanese Patent Application No. 02–156685 (Feb. 19, 1992).
Abstract of Japanese Patent Application No. 02–12817 (Sep. 24, 1991).
Abstract of Japanese Patent Application No. 01–291104 (Jun. 28, 1991).
Abstract of Japanese Patent Application No. 01–136866 (Jan. 9, 1991).
Abstract of Japanese Patent Application No. 01–246032 (May 8, 1991).
Abstract of Japanese Patent Application No. 01–105678 (Jan. 25, 1990).
Abstract of Japanese Patent Application No. 62–294670 (May 29, 1989).
Abstract of Japanese Patent Application No. 61–242322 (Apr. 26, 1988).
Abstract of Japanese Patent Application No. 61–117527 (Dec. 2, 1987).
Abstract of Japanese Patent Application No. 60–298366 (Jul. 13, 1987).
Abstract of Japanese Patent Application No. 60–103190 (Jun. 7, 1985).

PROCESS FOR PROVIDING A GLASS DIELECTRIC LAYER ON AN ELECTRICALLY CONDUCTIVE SUBSTRATE AND ELECTROSTATIC CHUCKS MADE BY THE PROCESS

FIELD OF THE INVENTION

The present invention relates to a process for providing a glass dielectric layer on an electrically conductive substrate and electrostatic chucks made by the process.

BACKGROUND

Electrostatic chucks (ESCs) are gaining popularity in the semiconductor wafer processing industry because they offer a variety of advantages over mechanical or vacuum chucks. Unlike vacuum chucks, electrostatic chucks are ideally suited for use in vacuum environments. As compared with mechanical chucks, ESCs have fewer moving parts, eliminate front side coverage of the wafer, and lessen risk of particle contamination. Ideally, ESCs offer the potential for rapid and strong clamping and declamping of semiconductor wafers over a range of temperatures without bowing or warping the wafer.

Although ESCs can have multiple structural configurations, they generally require a surface dielectric layer covering an electrode. A variety of dielectric coatings have been proposed for use in ESCs, including alumina (see, e.g., U.S. Pat. Nos. 5,413,360 to Atari et al., 5,384,681 to Kitabayashi and 5,207,437 to Barnes et al.), silica (see, e.g., Barnes et al.), silicon nitride (see, e.g., Atari et al.), tantalum oxide, diamond (see, e.g., U.S. Pat. No. 5,166,856 to Liporace), polyimide and polytetrafluoroethylene.

One of the challenges in ESC manufacture is the ability to reproducibly prepare dielectric coatings on metal electrodes that are durable and perform well over a range of temperatures and electric fields. Some glass or glass-ceramic compositions are known for making coatings on metal surfaces; however, the dielectric properties of these coatings and/or their compatibility in ESCs are not disclosed.

For example, U.S. Pat. No. 4,689,271 to Schittenhelm et al. discloses steel substrates coated with electrically insulating coatings of a fusible material comprising about 43–47 wt. % $B_2O_3$, 29–33 wt. % CaO, 10–15 wt. % $SiO_2$, 7–10 wt. % $Al_2O_3$ and 1–2 wt. % MgO.

JP 60-103190 discloses borosilicate coated metal articles that are particularly suited for use as electronic components. Table 1 of this reference summarizes four examples in which aluminum substrates were coated with varying amounts of $SiO_2$ (5–53%), $B_2O_3$ (10.5–19%), $Na_2O$ (0.0–4.2%), $Al_2O_3$ (0.0–15.0%), ZnO (1.5–20%), BaO (0.0–18%) and/or other oxides. Stainless steel is another substrate disclosed.

U.S. Pat. No. 5,515,521 to Fu et al. discloses borosilicate glass compositions suitable as protective coatings for metal substrates, such as non-pickled steel substrates. The compositions according to Fu et al. comprise 49.1–56.2% $SiO_2$ and 6.6–14.8% $B_2O_3$. Dielectric properties of the coating are not disclosed.

U.S. Pat. No. 3,175,937 to Bayer et al. discloses a method of bonding metal parts with a glass adhesive, such as a glass adhesive comprising about 38 parts $SiO_2$, 57 parts $B_2O_3$, 5 parts $Na_2O$ and 2 parts $Fe_2O_3$. Combinations of glass and metal are selected so that the glass has a coefficient of expansion less than, or not appreciably greater than, that of the metal.

U.S. Pat. No. 3,379,942 to Davis discloses barium-borate glass compositions suitable for use as capacitor dielectrics that comprise stacks of interleaved metal and glass layers. The barium-borate glasses include about 25–35 wt. % BaO, 5–10 wt. % $SiO_2$ and 1–6 wt. % $Al_2O_3$. Davis teaches that the composition must comprise some amount of $TiO_2$ because it improves chemical durability and maintains a low viscosity.

U.S. Pat. No. 4,221,824 to Leonard et al. discloses a method for enameling ferrous objects, such as steel, with a dielectric borosilicate coating including about 16–45 wt. % $SiO_2$, 10–26 wt. % $B_2O_3$ and 2–20 wt. % BaO and/or CaO. Leonard et al. teaches that the coating must comprise at least 5 wt. % of an adhesion promoting oxide, of which at least 1 wt. % must be cupric oxide.

The preparation of dielectric surface coatings for ESCs is complicated by factors including: stresses and porosity that are likely to form in coatings prepared from glass or ceramic green sheets (see, for example, Bang and Lu, "Constrained-Film Sintering of a Borosilicate Glass: In Situ Measurement of Film Stresses," J. Am. Ceram. Soc., 78(3), pgs. 813–815, 1995; Bang and Lu, "Densification Kinetics of Glass Films Constrained on Rigid Substrates," J. Mater. Res., 10(5), pgs. 1321–1326, 1995; and Choe et al., "Constrained-film Sintering of a Gold Circuit Paste," J. Mater. Res., 10(4), pgs. 986–994, 1995), and mismatch of thermal expansion coefficients (or linear coefficients of expansion). Unlike free films, and to a lesser extent sandwiched films, the exposed dielectric films on ESCs experience stresses that may lead to cracking or peeling of the dielectric layer. Further hazards for the ESC are exposure to reactive gases during processing of the semiconductor wafers, and chemical reaction with the silicon wafer. In addition, problems may arise from crystal growth or phase changes that may occur both in firing the coating on the ESC electrode as well as during temperature cycling during use of the ESC. Similarly, repeated electric field cycling during ESC clamping and declamping operations may degrade the coating. It has been reported that grain boundaries are critical sites at the clamping surface of the ESC. See Watanabe et al., "Electrostatic Charge Distribution in the Dielectric Layer of Alumina Electrostatic Chuck," J. Mater. Science 29, pgs. 3510–3516, 1994. Thus, the type and distribution of grain boundaries in the dielectric coating are another important consideration in the design of the ESC coatings. In summary, the myriad of complex and interrelated factors make the task of providing dielectric coatings for ESCs both challenging and unpredictable.

SUMMARY OF THE INVENTION

The present invention provides a method of making a smooth and uniform glass dielectric coating on an electrically conductive substrate in which a glass powder plus organic binder slip (i.e., slurry) is applied to the electrically conductive substrate and sintered to produce the glass dielectric coating.

The present invention further provides an electrostatic chuck in which an electrically conductive substrate is coated with a uniform and smooth surface layer of glass dielectric material.

The present invention provides a coating that offers multiple advantageous properties for use as a smooth dielectric coating on an electrically conductive substrate, especially for use in an electrostatic chuck. These advantageous properties include: excellent dielectric properties; efficient clamping and declamping of semiconductor wafers; a very smooth surface; excellent adhesion; excellent thermal shock and impact resistance; low porosity; greater thickness uniformity and range; protection of the underlying metal substrate from oxidation or chemical attack; excellent stability in harsh chemical environments; low cost of materials and manufacture; and high reproducibility in processing.

DETAILED DESCRIPTION OF PREFERRED EMBODIMENTS

Figure 1:
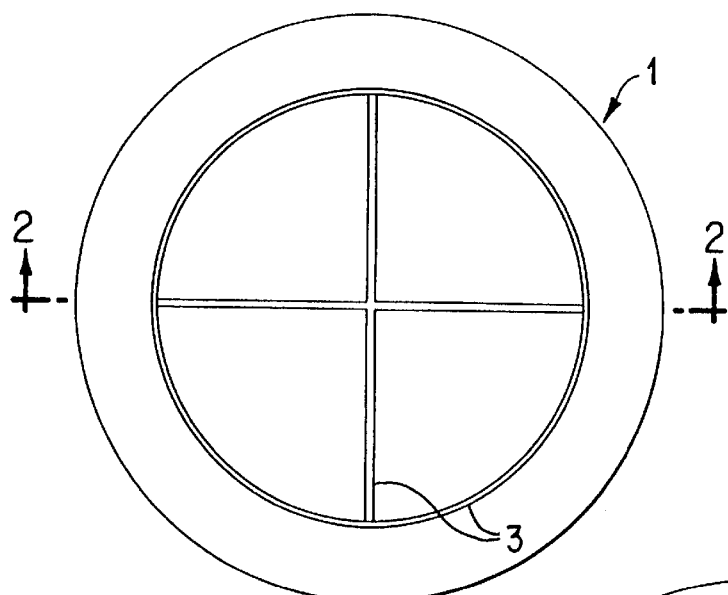
FIG. 1 illustrates a top view of an electrostatic chuck according to the present invention.
Figure 3:
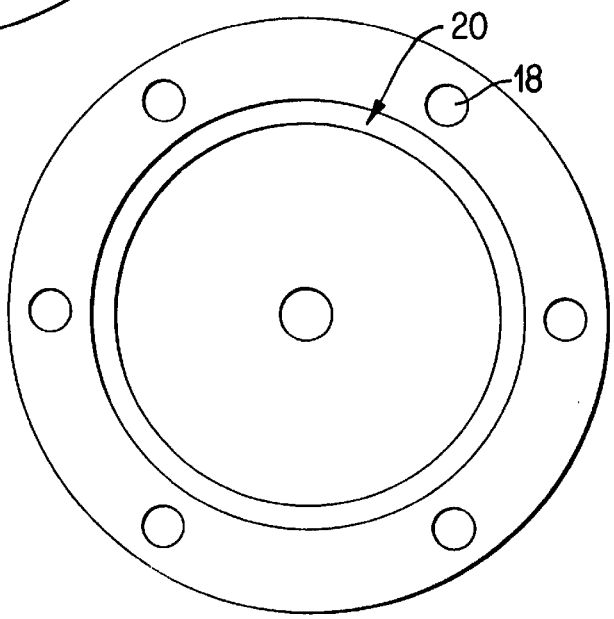
FIG. 3 is a bottom view of the electrostatic chuck of FIG. 1.
Figure 2:
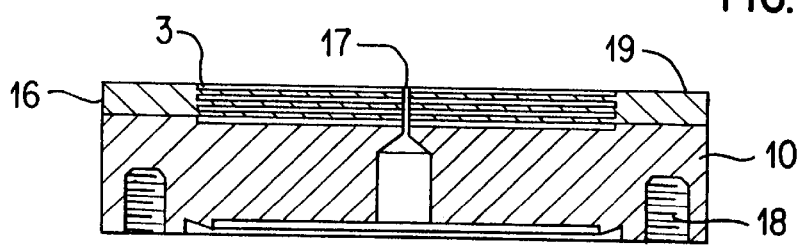
FIG. 2 is a cross-sectional view of the electrostatic chuck of FIG. 1.

The electrostatic chuck 1 of FIGS. 1–3 has a metallic body (i.e., electrode) 10, surface grooves 3, a through hole 17, mounting screw holes 18, and knife edge 20. The surface grooves 3 can be used for circulating a gas for uniform heating or cooling.

The electrostatic chuck design in FIGS. 1–3 is one embodiment of an electrostatic chuck with a glass coating according to the invention. Multiple ESC designs can be used with a glass coating according to the present invention. Monopolar, bipolar and multipolar DC designs as well as AC designs may be used in ESCs of the present invention. Examples of ESC designs are disclosed in U.S. Pat. Nos. 4,692,836; 4,864,461; 3,253,200; 5,055,964; 5,155,652; 5,376,213; and 5,384,681, and Japanese Patent Applications Nos. 05-19462, 04-344893, 04-109715, 04-70163, 03-190023, 03-91233, 03-76850, 02-156685, 02-12817, 01-291104, 01-246032, 01-136866, 01-105678, 62-294670, 61-242322, 61-117527 and 60-298366, incorporated herein by reference along with all other references cited herein as if reproduced in full below.

The electrode 10 most preferably comprises stainless steel; however, the electrode 10 can comprise other materials having suitable properties. Other suitable materials include metals and metal alloys, preferably transition metals and alloys thereof, more preferably metal alloys comprising at least two metals selected from the group consisting of iron, chromium, manganese, cobalt, nickel, copper, zinc, and aluminum.

The particular electrode material selected is guided by the desired properties of the material. The material must conduct electricity sufficiently to generate an electrostatic charge across the dielectric layer 16 and reversibly bind an object, such as a semiconductor wafer, to the dielectric layer 16. The material should be sufficiently durable to withstand, without substantial weakening, repeated exposure to typical conditions under which semiconductor device manufacturing processes are conducted (e.g., large pressure fluctuations, temperatures up to about 250° C., and large temperature fluctuations) and to typical chemicals employed in such processes.

FIG. 2 depicts a preferred embodiment of the invention having a dielectric layer 16 coated on the electrode 10. No interlayer of metal and/or adhesive is required between the dielectric layer 16 and the electrode 10 due to the excellent direct adhesion of the dielectric layer 16 to the electrode 10. In the context of this invention, the term "direct adhesion" encompasses adhesion of the dielectric layer 16 to an oxidized surface layer (not shown) of the electrode 10.

The dielectric layer 16 comprises a glass. Preferably, the dielectric layer material should be sufficiently durable to withstand, without substantial weakening of the material or the bonds formed therewith, repeated exposure to typical conditions under which semiconductor device manufacturing processes are conducted (e.g., large pressure fluctuations, temperatures up to about 250° C. and large temperature fluctuations) and to typical chemicals employed in such processes. The material should preferably have a thermal coefficient of expansion (TCE) or coefficient of linear expansion close to that of the electrode 10, good thermal shock resistance, high mechanical strength, strong resistance to chemical agents encountered in semiconductor device manufacturing, high breakdown voltages and high resistivity at typical temperatures at which semiconductor devices are manufactured (e.g., up to about 250° C.).

In certain preferred embodiments, the dielectric layer comprises a borosilicate glass, more preferably a borosilicate glass comprising about 60 wt. % to about 80 wt. % $SiO_2$ and about 10 wt. % to about 20 wt. % $B_2O_3$. Preferably, the borosilicate glass further comprises about 3 wt. % to about 13 wt. % $Na_2O$, about 2 wt. % to about 14 wt. % $Al_2O_3$ and about 1 wt. % to about 7 wt. % $Li_2O$. In especially preferred embodiments, the dielectric layer comprises about 60 wt. % to about 70 wt. % $SiO_2$, 15 wt. % to about 18 wt. % $B_2O_3$, about 7 wt. % to about 9 wt. % $Na_2O$, about 6 wt. % to about 9 wt. % $Al_2O_3$, and about 3 wt. % to about 5 wt. % $Li_2O$.

In certain preferred embodiments, the glass dielectric layer comprises about 60 wt. % to about 80 wt. % $SiO_2$, about 5 wt. % to about 20 wt. % $Na_2O$ and about 5 wt. % to about 20 wt. % BaO. Preferably, the glass dielectric layer further comprises about 1 wt. % to about 5 wt. % $K_2O$, less than about 2 wt. % $Al_2O_3$, less than about 2 wt. % MgO and less than about 2 wt. % CaO. In especially preferred embodiments, the glass dielectric layer comprises about 65 wt. % to about 75 wt. % $SiO_2$, about 8 wt. % to about 14 wt. % $Na_2O$, about 8 wt. % to about 12 wt. % BaO, about 2 wt. % to about 4 wt. % $K_2O$, about 0.5 wt. % to about 1.5 wt. % $Al_2O_3$, about 0.25 wt. % to about 0.75 wt. % MgO and about 0.25 wt. % to about 0.75 wt. % CaO.

The glass dielectric composition can comprise other materials, including metal oxides, preferably other alkali metal oxide(s) and/or other alkaline earth metal oxide(s). Certain embodiments do not contain titanium. Preferably, the films do not contain lead.

The dielectric layer 16 is preferably about 25 to about 200 microns thick, more preferably about 50 to about 100 microns thick.

The dielectric layer 16 of the ESCs must be tightly adhered to the substrate and the top surface of layer 16 must be smooth and free of chips and cracks. The terms smooth and uniform mean that the glass coating is evenly thick, without discontinuities or lumpiness. Preferably, the surface will not vary in height by more than about 5 $\mu$m and more preferably about 1 $\mu$m. While a smooth surface is important for clamping properties, the surface can have grooves or other configurations to improve chuck characteristics such as heating/cooling rate. In the electrostatic chuck illustrated in FIGS. 1–3, gas can enter through the hole 17, flow into the grooves 3 and escape through the gap between the chuck surface and the semiconductor wafer. In preferred embodiments, the dielectric surface is polished by conventional means to a particularly smooth finish.

The smooth surface is also free of cracks. The dielectric layer adheres well to the electrode. Preferably, the coating does not lose adhesion after being dropped 1.3 meters onto a concrete floor or after cooling in liquid nitrogen followed by immersion in water at 80° C. The dielectric properties of the dielectric layer are also quite important since the electrostatic force is dependent on the dielectric constant and thickness of the layer. It is advantageous to have insulating behavior with low leakage current. In preferred embodiments, the coating has a resistivity of at least $1\times10^{10}$ ohm-cm at 150° C. and at least $1\times10^{11}$ ohm-cm and more preferably $1\times10^{12}$ ohm-cm at 100° C.

In preferred methods, a dielectric layer precursor glass composition is formed into a slurry by mixing with organic binders, and optionally, a binder, a plasticizer, a deflocculant and/or a liquid carrier medium such as water or toluene. In certain preferred embodiments, the precursor glass composition contains no crystalline (i.e., no calcined or presintered) refractory material. The glass and organic binder mixture can be mixed in a ball mill or other suitable apparatus. The resulting slurry is preferably de-aired, filtered to remove large particles (preferably particles larger than about 15 μm), and applied to the surface of the electrode by conventional techniques such as tape casting or doctor blading. Either of these techniques are convenient and economical routes for producing thick films (for example, greater than 100 micron in thickness). Prior to applying the glass and organic binder mixture to the surface of the electrode, it is preferred to heat the electrode at a temperature for a sufficient period of time to form an oxide layer on the surface of the electrode. It has been found that heating the electrode to about 600° C. to about 750° C., preferably about 650° C., for about 30 minutes to about 60 minutes, produces an oxide layer that forms an especially durable bond with the glass dielectric coating. Preferably, the oxide layer is a continuous layer of about 0.2 μm to about 1 μm.

After the glass precursor film has been applied to the electrode, the binder is burned out in air, preferably at a temperature of about 500° C. In order to produce a dense dielectric coating, it is preferred that sintering be conducted at a temperature of about 650° C. to about 850° C., more preferably about 700° C. to about 850° C., even more preferably about 730° C. to about 800° C. The sintering time is preferably between 2 to 4 hours and more preferably about 3 hours. It is preferred to gradually adjust the heating and cooling rates at about 1° C./min. to about 7° C./min., more preferably about 2° C./min. to about 5° C./min.

EXAMPLES

Measurement Techniques

Thermal shock tests were carried out by a) heating a sample to 300° C. and quenching the sample in tap water; and b) cooling the sample to liquid nitrogen temperatures followed by immersion in water at about 80° C. To pass this test, samples do not chip, flake or crack.

Electrical resistivity was measured with a pico-amp meter (Hewlett Packard 4140B) at temperatures ranging up to 500° C. A constant voltage of 99 volts was applied to the test sample while it was being heated up to the target temperature and current readings were taken at regular intervals. Readings were also obtained during the cool-down cycle.

The microstructure and chemistry of the coatings were analyzed by a Scintag PTS x-ray diffractometer, Environmental Scanning Electron Microscope, and Electron Microprobe.

Example 1

A stainless steel substrate (SS-304, from Williams and Company, Inc., Charleston, W. Va.) is polished with 200-grit carbide sandpaper and then ultrasonically cleaned and degreased in an acetone bath for 30 minutes. The chuck is then washed with pure acetone and dried in air. As shown in FIGS. 1–2, the chuck body has surface grooves 1.5 mm wide and about 0.2 mm deep.

A slurry composition is prepared from: (i) 100 grams sodium borosilicate glass having a composition of $SiO_2$ (about 65 wt. %), $B_2O_3$ (about 15.9 wt. %), $Na_2O$ (about 8 wt. %), $Al_2O_3$ (about 7.4 wt. %) and $Li_2O$ (about 4 wt. %) (available from Sem-Com, Inc., Toledo, Ohio, product code SCQ-3); (ii) 2.00 grams fish oil (Defloc Z-3 fish oil, available from Reichhold Chemical, Inc., Research Triangle Park, N.C., Product Code 14424-00); (iii) 60.3 grams toluene; and (iv) 15.0 grams ethanol. This mixture is mixed in a ceramic jar mill or plastic bottle for 48 hours. Then 11.04 grams polyvinyl butyryl (Butvar B-79, available from Monsanto Chemical Co., St. Louis, Mo.) and 6.52 grams butyl benzyl phthalate (Santicizer 160, available from Monsanto Chemical Co., St. Louis, Mo.) are added and milled for an additional 48 hours. The mill speed is 60 to 65 rpm with alumina cylindrical media.

The slurry is degassed in vacuum. After heating the substrate to about 650° C. for about 45 minutes to form an oxide layer, the slurry is cast onto the substrate with a doctor blade to attain a green tape thickness of about 8 to 9 mil (1 mil=25.4 μm). The slurry settles into the surface grooves to form a grooved green tape whose shape conforms to that of the underlying substrate (see FIGS. 1–2). The green tape is allowed to air dry for 24 hours. If the through hole 17 is covered during casting, it can be cleared with a pin.

The green tape coated chuck is dried by placing it in a convection furnace and heating to about 115° C. in air at a rate of about 2° C./min. After 60 minutes of drying at about 115° C., the chuck is heated at a rate of about 2° C./min. to about 500° C. and held at about 500° C. for about 120 minutes in air to burnout the binder. The chuck is then heated to about 735° C. at a rate of about 2° C./min. The coating is sintered at that temperature for about 180 minutes, cooled at a rate of about 2° C./min to 30° C., and then cooled to room temperature. The resulting sintered film shows good smoothness and excellent adhesion. To achieve surface smoothness better than 1 μm, samples are polished for at least 72 hours on a Leco polishing wheel (Leco Corp., St. Joseph, Mich.) at 100 rpm with a flock twill cloth (Leco Part #810-470) and 1 μm diamond compound (Leco Part #810-869).

The resulting coated substrate has a very smooth surface morphology due to the borosilicate coating, which durably adheres to 100% of the surface to which it is applied. The coating is about 90 μm thick. The electrical resistivity of the coating is at least about $1\times10^{10}$ ohm-cm at 150° C.

Example 2

In this example, the procedure described in Example 1 is repeated except that the slurry is prepared from 100 grams of a glass composition comprising about 70 wt. % $SiO_2$, about 10–12 wt. % $Na_2O$, about 10 wt. % BaO, about 3 wt. % $K_2O$, about 1 wt. % $Al_2O_3$ about 0.5 wt. % MgO and about 0.5 wt. % CaO (available from GBC, Inc., Latrobe, Pa., product code GBC-365), and the sintering temperature is 800° C.

The resulting coated substrate has a very smooth surface morphology due to the glass coating, which durably adheres to 100% of the surface to which it is applied. The coating is about 90 μm thick. The electrical resistivity of the coating is at least about $1\times10^{10}$ ohm-cm at 150° C.

Example 3

In this comparative example, the procedure described in Example 1 is repeated except that the coating is prepared from 100 grams of lead zinc borosilicate glass having an approximate composition of ZnO (<75%), $B_2O_3$ (<25%), $SiO_2$ (<25%), PbO (<10%), and CuO (<5%) (available from Sem-Com, Inc., product code SCC-7), and the sintering temperature is 715° C.

The resulting coated substrate has a smooth, but discontinuous, surface morphology. The borosilicate coating adheres very poorly, if at all, and exhibits discoloration that is indicative of a strong chemical reaction between the borosilicate coating and the stainless steel substrate.

Example 4

In this comparative example, the procedure described in Example 1 is repeated except that the coating is prepared from 100 grams of aluminosilicate glass having an approximate composition of $SiO_2$ (<50%), $Al_2O_3$ (<25%), CaO (<25%) and MgO (<25%) (available from Sem-Com, Inc., product code SCE-5), the coated substrate is sintered at 900° C. for about 180 minutes, cooled at a rate of about 2° C./min. to 600° C., held at that temperature for about 60 minutes, and then cooled to room temperature at a rate of about 2° C./min.

No coating remains on the substrate by the time that sintering is completed due to very poor adhesion.

Example 5

In this comparative example, the procedure described in Example 4 is repeated except that the coating is prepared from 100 grams of magnesium aluminosilicate glass having an approximate composition of $SiO_2$ (<60%), MgO (<25%), $Al_2O_3$ (<25%) and $B_2O_3$ (<5%) (available from Sem-Com, Inc., product code SCE-505).

The resulting coated substrate has a smooth surface morphology with many spalled regions. The surface of a substrate less than about 3 mm in thickness is 95% coated; however, thicker substrates have almost no coating due to TCE mismatch.

Example 6

In this comparative example, the procedure described in Example 5 is repeated except that 1 wt. % additional alumina is added to the coating.

The resulting coated substrate has a smooth surface morphology with some spalled regions. The surface of a substrate less than about 3 mm in thickness is 99% coated; however, thicker substrates have almost no coating due to TCE mismatch.

While the invention has been described in detail and with reference to specific examples thereof, it will be apparent to one skilled in the art that various changes and modifications can be made therein without departing from the spirit and scope thereof.

What is claimed is:

1. An electrostatic chuck comprising:
   an electrically conductive stainless steel substrate, said stainless steel substrate having an oxide layer formed on a surface thereof; and
   a glass dielectric layer comprising 60 wt. % to 80 wt. % $SiO_2$ coated on said oxide layer of said stainless steel substrate;
   said glass dielectric layer including a surface for contacting an object.

2. The electrostatic chuck according to claim 1, wherein the glass dielectric layer further comprises about 10 wt. % to about 20 wt. % $B_2O_3$.

3. The electrostatic chuck according to claim 2, wherein the glass dielectric layer comprises 15 wt. % to 20 wt. % $B_2O_3$.

4. The electrostatic chuck according to claim 2, wherein the glass dielectric layer further comprises about 3 wt. % to about 13 wt. % $Na_2O$, about 2 wt. % to about 14 wt. % $Al_2O_3$ and about 1 wt. % to about 7 wt. % $Li_2O$.

5. The electrostatic chuck according to claim 2, wherein said glass dielectric layer is about 25 μm to about 200 μm thick.

6. The electrostatic chuck according to claim 2, wherein said glass dielectric layer has a resistivity of at least $1 \times 10^{10}$ ohm-cm at 150° C.

7. The electrostatic chuck according to claim 2, wherein said glass dielectric layer does not contain titanium.

8. The electrostatic chuck according to claim 1, wherein the glass dielectric layer further comprises about 5 wt. % to about 20 wt. % $Na_2O$ and about 5 wt. % to about 20 wt. % BaO.

9. The electrostatic chuck according to claim 8, wherein said glass dielectric layer is about 25 μm to about 200 μm thick.

10. The electrostatic chuck according to claim 8, wherein said glass dielectric layer has a resistivity of at least $1 \times 10^{10}$ ohm-cm at 150° C.

11. The electrostatic chuck according to claim 8, wherein said glass dielectric layer does not contain titanium.

12. The electrostatic chuck according to claim 1, wherein the glass dielectric layer comprises about 65 wt. % to about 75 wt. % $SiO_2$, about 8 wt. % to about 14 wt. % $Na_2O$, about 8 wt. % to about 12 wt. % BaO, about 2 wt. % to about 4 wt. % $K_2O$, about 0.5 wt. % to about 1.5 wt. % $Al_2O_3$, about 0.25 wt. % to about 0.75 wt. % MgO and about 0.25 wt. % to about 0.75 wt. % CaO.

13. The electrostatic chuck according to claim 1, wherein the glass dielectric layer comprises about 60 wt. % to about 70 wt. % $SiO_2$, about 15 wt. % to about 18 wt. % $B_2O_3$, about 7 wt. % to about 9 wt. % $Na_2O$, about 6 wt. % to about 9 wt. % $Al_2O_3$ and about 3 wt. % to about 5 wt. % $Li_2O$.

14. A process for producing the electrostatic chuck according to claim 1, comprising:
   providing the electrically conductive stainless steel substrate;
   heating said electrically conductive stainless steel substrate to a temperature for a period of time sufficient to provide said oxide layer on said surface of said electrically conductive stainless steel substrate;
   coating on said at least one oxidized surface of said electrically conductive stainless steel substrate a glass composition comprising 60 wt. % to 80 wt. % $SiO_2$; and
   sintering said coated substrate to produce said electrostatic chuck.

15. The process according to claim 14, wherein said sintering is conducted in air at a temperature of about 650° C. to about 850° C.

16. The process according to claim 14, wherein said at least one surface of said electrically conductive stainless steel substrate is oxidized at a temperature of about 600° C. to about 750° C. for a period of about 30 minutes to about 60 minutes.

17. The process according to claim 14, wherein said electrostatic chuck is provided with a surface that conforms to a shape of an object to be electrostatically held by said electrostatic chuck.

18. The process according to claim 14, wherein the glass composition further comprises 15 wt. % to 20 wt. % $B_2O_3$.

19. The process according to claim 14, wherein the glass composition comprises about 65 wt. % to about 75 wt. % $SiO_2$, about 8 wt. % to about 14 wt. % $Na_2O$, about 8 wt. % to about 12 wt. % BaO, about 2 wt. % to about 4 wt. % $K_2O$, about 0.5 wt. % to about 1.5 wt. % $Al_2O_3$, about 0.25 wt. % to about 0.75 wt. % MgO and about 0.25 wt. % to about 0.75 wt. % CaO.

* * * * *